United States Patent
Ooi (10) Patent No.: US 9,787,311 B1
(45) Date of Patent: Oct. 10, 2017

(54) METHODS AND DEVICES FOR REDUCING CLOCK SKEW IN BIDIRECTIONAL CLOCK TREES

(71) Applicant: Altera Corporation, San Jose, CA (US)

(72) Inventor: Boon Haw Ooi, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/278,295

(22) Filed: Sep. 28, 2016

(51) Int. Cl.
G06F 1/04 (2006.01)
H03K 19/177 (2006.01)
H03K 19/173 (2006.01)
G06F 1/10 (2006.01)

(52) U.S. Cl.
CPC .......... H03K 19/1774 (2013.01); G06F 1/10 (2013.01); H03K 19/1737 (2013.01); H03K 19/17728 (2013.01)

(58) Field of Classification Search
CPC H03K 19/17736; H03K 19/1774; G06F 1/04; G06F 1/06; G06F 1/10
See application file for complete search history.

(56) References Cited

U.S. PATENT DOCUMENTS

| | | | |
|---|---|---|---|
| 6,311,313 B1 * | 10/2001 | Camporese | G06F 1/10 716/113 |
| 7,120,891 B2 * | 10/2006 | Yamamoto | G06F 1/10 716/126 |
| 7,191,418 B2 * | 3/2007 | Lee | G06F 17/505 716/114 |
| 7,228,451 B1 | 6/2007 | Nguyen et al. | |
| 7,737,751 B1 | 6/2010 | Lai et al. | |
| 8,736,342 B1 * | 5/2014 | Bucelot | G06F 1/10 327/291 |
| 9,503,057 B1 | 11/2016 | Venkata et al. | |
| 2002/0073385 A1 * | 6/2002 | Slawecki | G06F 1/10 713/500 |
| 2012/0169394 A1 * | 7/2012 | Hsieh | G06F 1/10 327/291 |
| 2014/0225645 A1 * | 8/2014 | Sharma | G06F 1/10 326/98 |

(Continued)

OTHER PUBLICATIONS

G. Geannopoulos, An Adaptive Digital Deskewing Circuit for Clock Distribution Networks, SP 25.3, 1998, IEEE.

(Continued)

*Primary Examiner* — Jason M Crawford
(74) *Attorney, Agent, or Firm* — Fletcher Yoder PC (57) ABSTRACT

The present disclosure provides systems and methods for improving operation of integrated circuit device including a logic region, which includes a plurality of logic gates that operate based at least in part on a clock signal to facilitate providing a target function, and a clock tree, which includes a clock switch block that receives a source clock signal from a clock source and a branch communicatively coupled between the clock switch block and the logic region, in which the branch operates to provide the clock signal to the logic region based at least in part on the source clock signal and the branch includes a tunable delay buffer that operates to apply a delay to the clock signal based at least in part on a clock skew expected to be introduced by the branch.

20 Claims, 4 Drawing Sheets

(56) References Cited

U.S. PATENT DOCUMENTS

2015/0234422 A1* 8/2015 Bucelot .................... G06F 1/10
                   327/295

OTHER PUBLICATIONS

Xilinx, "Mixed-Mode Clock Manager (MMCM) Module (v1.00a)"; Jun. 24, 2009.
Xilinx, "UltraScale Architecture Clocking Resources"; v1.0; Dec. 10, 2013.
Xilinx, "MMCM and PLL Dynamic Reconfiguration"; v1.6.1; Jun. 1, 2016.
Charles E. Dike et al., A Design for Digital, Dynamic Clock Deskew, A Design for Digital, Dynamic Clock Deskew, 5 pages.

* cited by examiner

METHODS AND DEVICES FOR REDUCING CLOCK SKEW IN BIDIRECTIONAL CLOCK TREES

BACKGROUND

The present disclosure generally relates to integrated circuit devices and, more particularly, to clock trees implemented in an integrated circuit device.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, an electronic device or an electrical system may include one or more integrated circuit (IC) devices. To improve operational flexibility, in some instances, an integrated circuit device may be a programmable logic device that is programmable (e.g., configurable) after manufacturing to provide one or more target (e.g., desired) functions, such as a field programmable gate array (FPGA). To facilitate providing a target function, an integrated circuit device may include one or more logic elements (e.g., blocks and/or gates), for example, programmed (e.g., configured) to operate based at least in part on corresponding configuration data.

In some instances, the logic elements in an integrated circuit device may be organized into multiple logic regions, for example, with each logic region providing a target function and/or multiple logic regions cooperating to provide a target function. Thus, in operation, the integrated circuit device may coordinate (e.g., synchronize) operation of multiple logic regions. Since logic elements generally operates based at least in part on a received clock signal, in some instances, the integrated circuit device may coordinate operation of multiple logic regions by supplying the clock signal to corresponding logic elements using a clock tree (e.g., a clock network-on-chip). For example, the clock tree may include multiple branches that each communicates the clock signal through a corresponding logic region.

However, in some instances, a clock signal may become skewed (e.g., time-shifted or phase-shifted) as it is communicated through the clock tree, for example, due to length of the branches and/or stages (e.g., muxes or buffers) along the branches. In fact, likelihood and/or magnitude of clock skew may increase as size of the clock tree increases, variation in length of the branches increases, and/or due to programming of the integrated circuit device. Since operating based at least in part on the clock signal, clock skew may affect operation of the logic elements and, thus, the integrated circuit device, for example, by decreasing operational efficiency and/or increasing operational latency

SUMMARY

A summary of certain embodiments disclosed herein is set forth below. It should be understood that these aspects are presented merely to provide the reader with a brief summary of these certain embodiments and that these aspects are not intended to limit the scope of the present disclosure. Indeed, the present disclosure may encompass a variety of aspects that may not be set forth below.

The present disclosure generally relates to integrated circuit (IC) devices, which may operate to perform one or more target (e.g., desired) functions in an electrical system. To facilitate performing a target function, in some embodiments, an integrated circuit device may include one or more logic elements (e.g., blocks or gates) that operate based at least in part on a received clock signal, for example, to perform a logic operation and/or an arithmetic operation used in providing a combinational function, a sequential function, an arithmetic functions, a logic function, and/or a custom function. Thus, in some embodiments, the integrated circuit device may include a clock tree (e.g., a clock network-on-chip) that communicates a clock signal to various logic elements. However, in some instances, the clock signal may become skewed as it is communicated through the clock tree, thereby affecting operation of the logic elements and, thus, the integrated circuit device.

Accordingly, the present disclosure provides techniques to improve operation (e.g., operational efficiency and/or operational latency) of an integrated circuit device by reducing likelihood of clock skew affecting operation. In some embodiments, an integrated circuit device includes a logic region, which includes a plurality of logic gates that operate based at least in part on a clock signal to facilitate providing a target function, and a clock tree, which includes a clock switch block that receives a source clock signal from a clock source and a branch communicatively coupled between the clock switch block and the logic region, in which the branch operates to provide the clock signal to the logic region based at least in part on the source clock signal and the branch includes a tunable delay buffer that operates to apply a delay to the clock signal based at least in part on a clock skew expected to be introduced by the branch.

Additionally, in some embodiments, a method for controlling operation of an integrated circuit device includes routing, using a clock switch block, a source clock signal to a first branch in a clock tree to enable a first logic region of the integrated circuit device communicatively coupled to the first branch to operate based at least in part on the source clock signal; routing, using the clock switch block, the source clock signal to a second branch in the clock tree to enable a second logic region of the integrated circuit device communicatively coupled to the second branch to operate based at least in part on the source clock signal; receiving, using the clock switch block, a first feedback clock signal from the first branch, in which the first feedback clock signal includes the source clock signal with a first delay introduced by the first branch; receiving, using the clock switch block, a second feedback clock signal form the second branch, in which the second feedback clock signal includes the source clock signal with a second delay introduced by the second branch; and determining, using the clock switch block, skew data indicative of phase variation between the first feedback clock signal and the second feedback clock signal to enable the integrated circuit device to adjust the first delay, the second delay, or both to reduce magnitude of the phase variation.

Furthermore, in some embodiments, a tangible, non-transitory, computer-readable medium stores instructions executable by one or more processors in an electrical system, in which the instructions comprise instruction to determine, using the one or more processors, skew data indicative of difference between a first delay introduced on a source clock signal resulting from routing the source clock signal to a first portion of an integrated circuit device via a clock tree and a second delay introduced on the source clock signal resulting from routing the source clock signal to a second portion of the integrated circuit device via the clock tree; and instruct, using the one or more processors, one or more tunable delay buffers to adjust delay applied to the source clock signal by the clock tree based at least in part on the skew data to facilitate coordinating operation of the first portion of the integrated circuit device and the second portion of the integrated circuit device.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Generally, an integrated circuit device operates to provide one or more target functions in an electrical system. For example, the target functions may include combinational functions, sequential functions, arithmetic functions, logic functions, and/or custom function. Thus, in some embodiments, an integrated circuit device may operate to process data, analyze data, store data, and/or read data.

Figure 1:
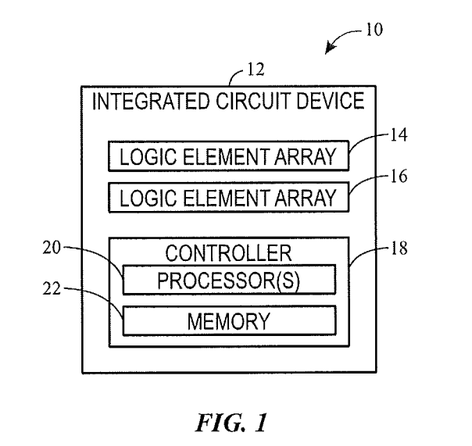
FIG. 1 is a block diagram of an electrical system including an integrated circuit device, in accordance with an embodiment.

To help illustrate, one embodiment of an electrical system 10 including an integrated circuit device 12 is shown in FIG. 1. In some embodiments, the electrical system 10 may be included in an industrial system, a manufacturing system, an automation system, or the like, such as a factory or plant. Additionally, in some embodiments, the electrical system 10 may be included in an electronic device, such as a handheld computing device, a tablet computing device, a notebook computer, a desktop computer, or the like. Furthermore, in some embodiments, electrical system 10 may be included in an automotive system, such as an airplane, boat, or car.

Thus, although one integrated circuit device 12 is depicted, it should be appreciated that this is merely intended to be illustrative and not limiting. In other words, in other embodiments, the electrical system 10 may include multiple integrated circuit devices 12. For example, the electrical system 10 may include a first integrated circuit 12 (e.g., central processing unit or graphics processing unit) communicatively coupled with a second integrated circuit 12 (e.g., random-access memory).

In any case, as depicted, the integrated circuit device 12 includes a logic element array 14, a clock tree 16, and a controller 18. In some embodiments, the controller 18 may control operation of the logic element array 14 and/or the clock tree 16. To facilitate controlling operation, the controller 18 may include a controller processor 20 and controller memory 22. In some embodiments, the controller 18 may control operation based at least in part on circuit connections (e.g., logic gates) formed in the controller 18.

Additionally or alternatively, the controller processor 20 may execute instructions stored in the controller memory 22. Thus, in some embodiments, the controller processor 20 may include one or more general purpose microprocessors, one or more application specific processors (ASICs), one or more field programmable logic arrays (FPGAs), and/or the like. Additionally, in some embodiments, the controller memory 22 may include one or more tangible, non-transitory, computer-readable mediums. For example, the controller memory 22 may include random access memory (RAM), read only memory (ROM), rewritable non-volatile memory, such as flash memory, hard drives, optical discs, and/or the like.

As described above, the integrated circuit device 12 may operate to perform one or more target functions in the electrical system 10. To facilitate providing a target function, the logic element array 14 may include communicatively coupled logic elements (e.g., blocks or gates) that operate to perform combinational functions, sequential functions, arithmetic functions, logic functions, and/or custom functions. Additionally, in some embodiments, the logic element array 14 may be divided into one or more logic regions, which each includes one or more logic elements.

Figure 2:
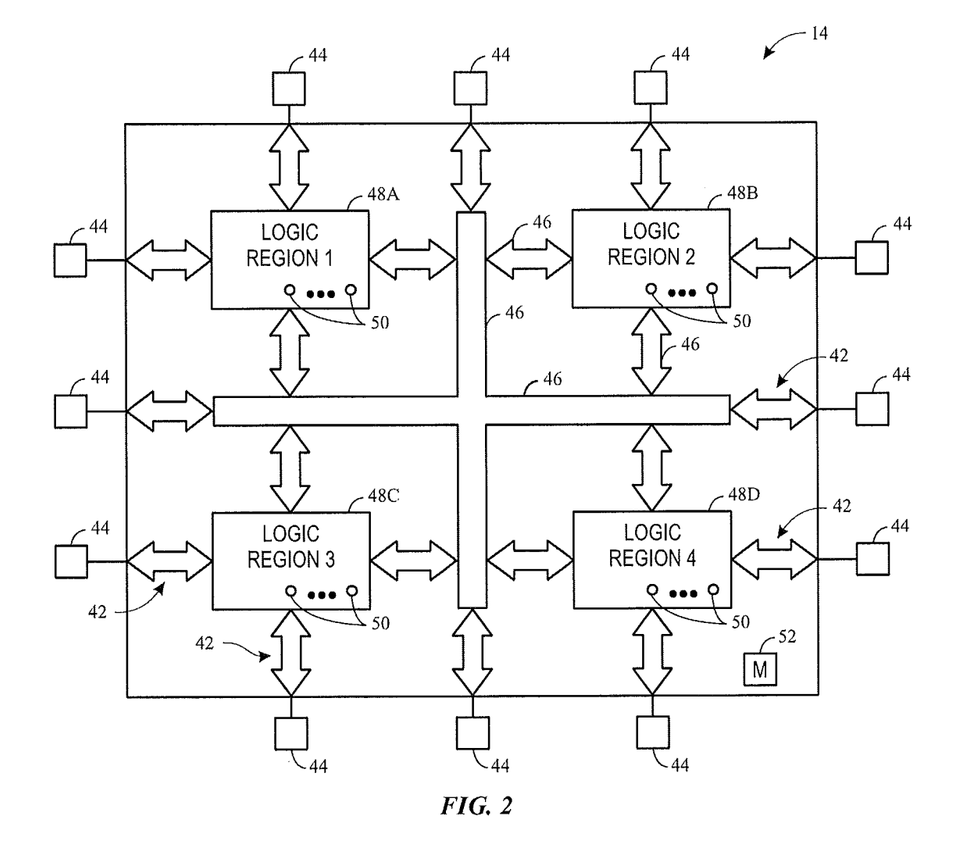
FIG. 2 is a block diagram of a logic element array included in the integrated circuit device of FIG. 1, in accordance with an embodiment.

To help illustrate, one embodiment of a logic element array 14 organized into multiple logic regions 48 is shown in FIG. 2. In particular, the depicted embodiment includes a first logic region 48A, a second logic region 48B, a third logic region 48C, and a fourth logic region 48D, which each includes one or more logic elements 50. In some embodiments, a logic element 50 may include one or more muxes, one or more flip-flops, one or more logic gates, one or more logic blocks, one or more look-up-tables, and/or one or more registers.

In some embodiments, the logic element array 14 may be organized such that different logic regions 48 operate to perform different target functions. Additionally or alternatively, the logic element array 14 may be organized such that multiple logic regions 48 cooperate to perform a target function. Thus, to facilitate proper operation of the integrated circuit device 12, operation of different logic regions 48 may be coordinated (e.g., synchronized) and/or data communication may be provided.

To facilitate data communication, the logic element array 14 may include input/output circuitry 42, input/output pins 44, and an internal communication network 46 (e.g., a network-on-chip). In some embodiments, the input/output circuitry 42 may facilitate external data communication via the input/output pins 44, for example, between the logic element array 14 and another integrated circuit device 12. Additionally, in some embodiments, internal communication network 46 may facilitate internal data communication, for example, between logic regions 48 and/or with input/output circuitry 42. Thus, in some embodiments, the internal communication network 46 may include interconnects, such as conductive lines and/or busses. Furthermore, in some embodiments, the internal communication network 46 may include fixed interconnects and/or programmable interconnects.

Additionally, in some embodiments, the logic elements 50 and, thus, the logic regions 48 operate based at least in part on a received clock signal. In particular, operations may be performed based on rising edges and/or falling edges of the received clock signal. Thus, to facilitate coordinating operation of multiple logic regions 48, approximately the same clock signal may be communicated to corresponding logic elements 50 in the logic regions 48.

Figure 3:
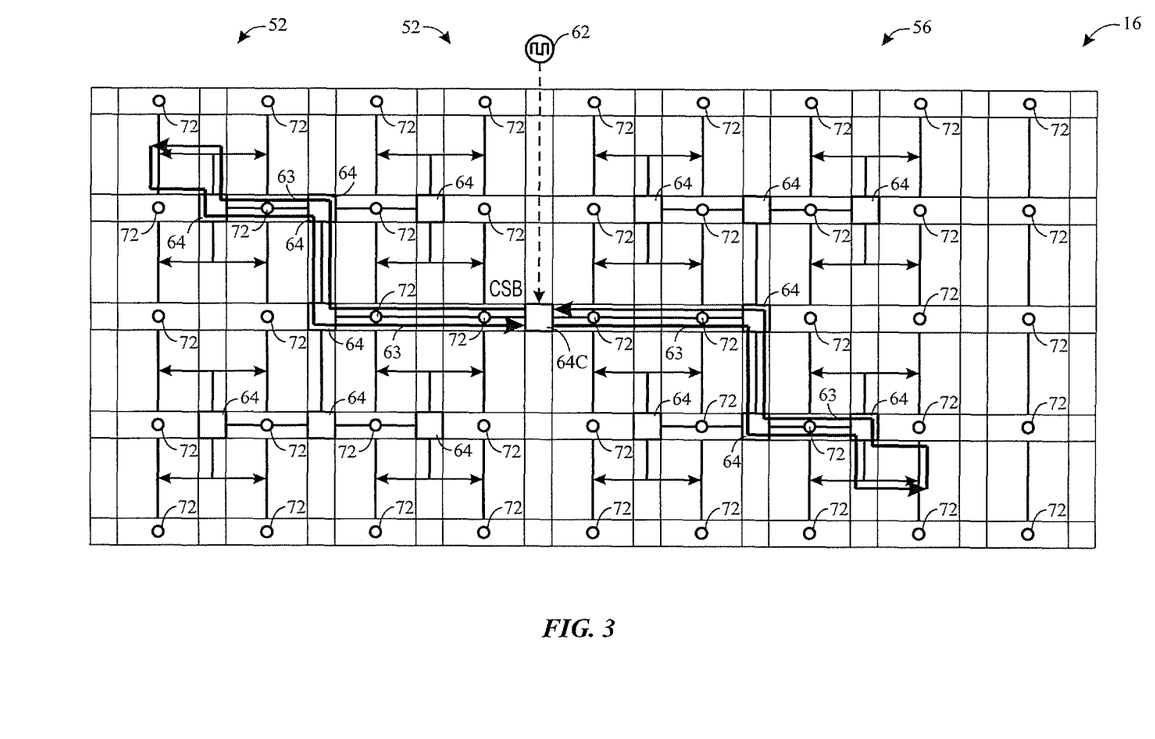
FIG. 3 is a block diagram of a clock tree included in the integrated circuit device of FIG. 1, in accordance with an embodiment.

Returning to the integrated circuit device 12 of FIG. 1, the clock tree 16 may facilitate communicating a clock signal to the various logic regions 48. To help illustrate, one embodiment of a clock tree 16 is shown in FIG. 3. In particular, in the depicted embodiment, the clock tree 16 is a bi-directional H-tree formed using a pre-built clock grid. It should be appreciated that the described embodiment of the clock tree 16 is merely intended to be illustrative and not limiting. In other words, in other embodiments, the techniques described in the present disclosure may be implement in other clock tree configurations.

With regard to the depicted embodiment, the clock tree 16 includes clock interconnects 63, clock switch blocks 64, and tunable delay buffers 74 (e.g., delay devices). In operation, a clock switch block 64 may receive a source clock signal from a clock source 62, for example, directly from the clock source 62 and/or via an upstream clock switch block 64. Additionally, the clock switch block 64 may route the source clock through a one or more tunable delay devices 74 via a block interconnect 63 and/or to a target logic region 48.

In this manner, the clock tree 16 may route the source clock signal to logic elements 50 and/or logic regions 48 in the logic element array 14. For example, in the depicted embodiment, the clock tree 16 includes a first branch 60A that may be used to route the source clock signal to the first logic region 48A. Additionally, in the depicted embodiment, the clock tree 16 includes a second branch 60B that may be used to route the source clock signal to the fourth logic region 48D.

Additionally, in some embodiments, the clock tree 16 may route a feedback clock signal from logic elements 50 and/or logic regions 48 in the logic element array 14 to one or more clock switch block 64. For example, in the depicted embodiment, the first branch 60A may be used to route a first feedback clock signal from the first logic region 48A. Additionally, the second branch 60B may be used to route a second feedback clock signal from the fourth logic region 48D. It should be appreciated that the clock tree 16 may additionally or alternatively be implemented to include one or more branches 60 to route the source clock signal to and/or feedback clock signals from other logic regions 48 (e.g., second logic region 48B and/or third logic region 48C).

As described above, in some instances, routing clock signals through the clock tree 16 may introduce clock skew, for example, due to variations in branch length, stages (e.g., muxes or buffers) along the branches, and/or other electrical factors (e.g., process variation). However, as described above, clock skew may affect operation of the logic elements 50 and, thus, coordination between different logic regions 48 in an integrated circuit device 12. Thus, in some embodiments, operation of one or more tunable delay buffers 74 along a branch 60 may be controlled based at least in part on expected clock skew.

Figure 4:
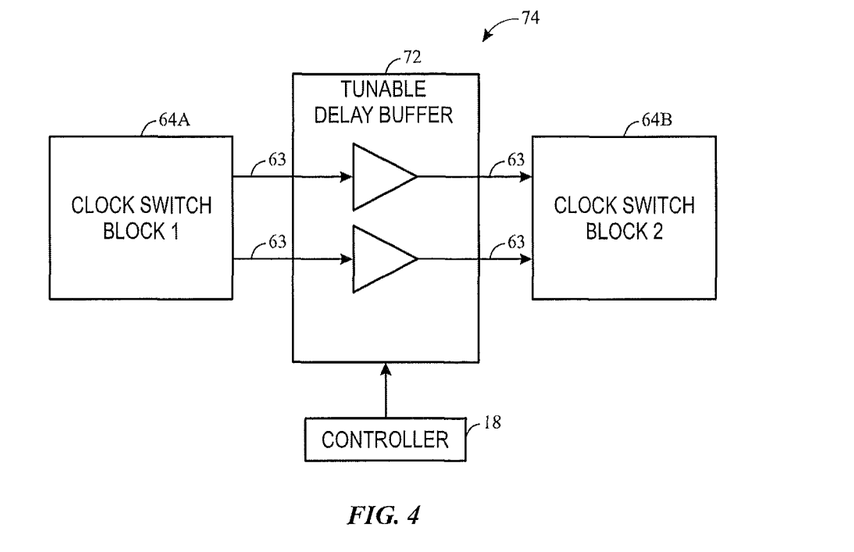
FIG. 4 is a block diagram of a portion of the clock tree of FIG. 3, in accordance with an embodiment.

To help illustrate, a portion 74 of the clock tree 16 is shown in FIG. 4. As depicted, the portion 74 includes a first clock switch block 64A communicatively coupled to a second clock switch block 64B via clock interconnects 63 through a tunable delay device 72. Additionally, as depicted, the controller 18 is communicatively coupled to the tunable delay device 72. In this manner, the controller 18 may instruct the tunable delay buffer 72 to adjust delay applied on a corresponding clock interconnect 63 based at least in part on expected clock skew, for example, to implement a phase-locked loop (PLL) and/or a delay-locked loop (DLL).

Figure 5:
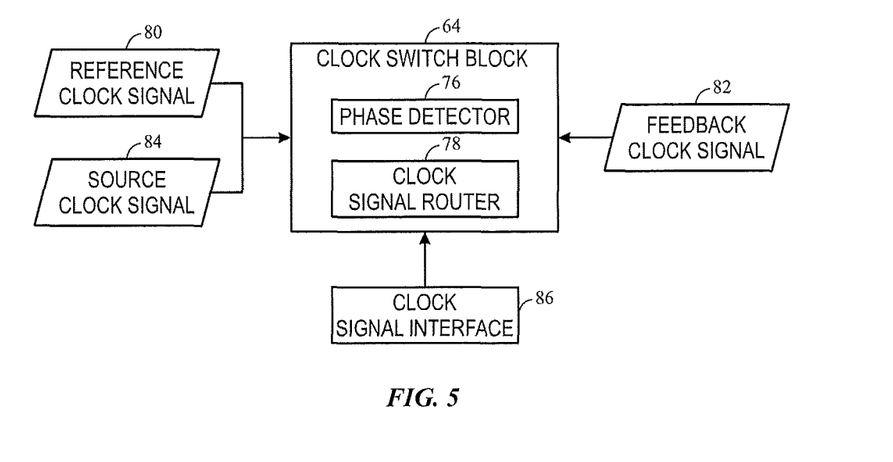
FIG. 5 is a block diagram of a clock switch block (CSB) included in the clock tree of FIG. 3, in accordance with an embodiment.

In some embodiments, a clock switch block 64 may facilitate determining the clock skew expected to be introduced by a branch 60, for example, with reference to clock skew introduced by another branch 60. To help illustrate, one embodiment of a clock switch block 64 is shown in FIG. 5. As depicted, the clock switch block 64 includes a phase detector 76 and a clock signal router 78. Additionally, as depicted, the clock switch block 64 receives a reference clock signal 80, a feedback clock signal 82, and a source clock signal 84.

In some embodiments, the source clock signal 84 may be received from an upstream clock switch block 64 and/or from the clock source 62. For example, with regard to FIG. 4, the second clock switch block 64B may receive the source clock signal 84 from the first clock switch block 64A. Additionally, in some embodiments, the feedback clock signal 82 may be received from a downstream clock switch block 64. For example, the first clock switch block 64A may receive the feedback clock signal 82 from the second clock switch block 64B.

Returning to FIG. 5, the clock signal router 78 may determine routing of the source clock signal 84 and/or the feedback clock signal 82. For example, the clock signal router 78 may determine whether to route the source clock signal 84 to a downstream clock switch block 64 or to a corresponding logic region 48 via a clock signal interface 86. In some embodiments, operation of the clock signal router 78 and/or the logic element array 14 may be programmable (e.g., configurable), for example, by a programming system.

Figure 6:
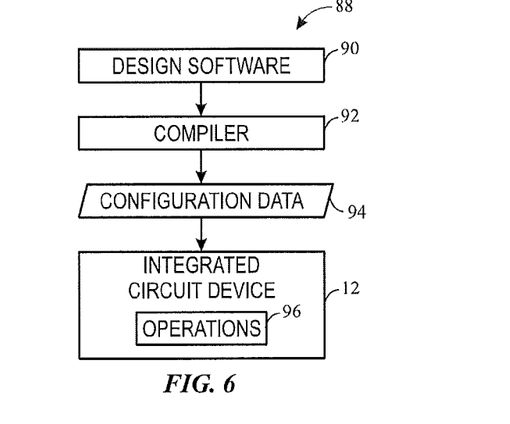
FIG. 6 is a block diagram of a programming system used to program operation of the integrated circuit device of FIG. 1, in accordance with an embodiment.

To help illustrate, one embodiment of a programming system 88 that may be used to program (e.g., configure) operation of an integrated circuit device 12 is shown in FIG.

12. In some embodiments, the programming system 88 may enable programming operation of the integrated circuit device 12 during semiconductor manufacturing, for example, using mask programming arrangements. Additionally, in some embodiments, the programming system 88 may enable one-time programming of the integrated circuit device 12 after manufacture, for example, using fuses and/or antifuses.

Furthermore, in some embodiments, the programming system 88 may enable dynamically programming (e.g., reprogramming) operation of the integrated circuit device 12 when the integrated circuit device 12 is a programmable (e.g., reconfigurable) logic device, such as a field programmable gate array (FPGA). In some embodiments, the integrated circuit device 12 may be programmed using design software 90, such as a version of Quartus by Altera™. Additionally, the design software 90 may use a compiler 92 to generate configuration data 94, such as a low-level circuit-design kernel program, sometimes known as a program object file.

To program the integrated circuit device 12, the configuration data 94 may be stored, for example, in configuration memory 52 shown in FIG. 2. In some embodiments, the configuration memory 52 may be implemented as random-access-memory (RAM) cells. Since these RAM cells are loaded with configuration data during programming, they are sometimes referred to as configuration RAM cells (CRAM). Based at least in part on the configuration data, control signals may be generated to control operation 96 of the integrated circuit device 12.

For example, based at least in part on target function configuration data, a control signal may be applied to the gate of a metal-oxide-semiconductor (e.g., logic element 50) to control operation in a manner that facilitates implementing a corresponding target function. In some embodiments, based at least in part on data routing configuration data, a control signal may be supplied to the internal communication network 46 to control data routing in a manner that facilitate implementing a corresponding target data routing configuration. Additionally or alternatively, based at least in part on clock routing configuration data, a control signal may be supplied to the clock switch blocks 64 to control clock signal routing in a manner that facilitates implementing a corresponding clock routing configuration (e.g., implementation of branches 60 in the clock tree 16).

In some instances, programming (e.g., reprogramming) an integrated circuit device 12 to adjust operation and/or configuration of the clock tree 16 may affect electrical factors. For example, reprogramming a branch 60 from a first routing configuration to a second routing configuration may affect branch length and/or stages (e.g., muxes or buffers) along the branch 60. Thus, in such instances, programming (e.g., reprogramming) the integrated circuit device 12 may further increase likelihood and/or magnitude of clock skew introduced by a clock tree 16.

To facilitate reducing likelihood of clock skew affecting operation of the integrated circuit device 12, returning to FIG. 5, the phase detector 76 may determine skew (e.g., phase-shift or time-shift) data based at least in part on the feedback clock signal 82 and the reference clock signal 80. As described above, in some embodiments, clock skew expected to be introduced by one branch 60 may be determined with reference to clock skew introduced by another branch 60 in the clock tree 16. In other words, in such embodiments, the reference clock signal 80 may be received from a different branch 60 compared to the feedback clock signal 82. For example, with regard to FIG. 3, the central clock switch block 64C may receive a first feedback signal 82 from the first branch 60A and a second feedback signal 82 from the second branch 60B. Thus, to determine clock skew on the second branch 60B, the central clock switch block 64C may use the first feedback signal 82 as the reference clock signal 80. In other embodiments, the reference clock signal 80 may be predetermined, for example, by time shifting and/or phase shifting the source clock signal 84.

Figure 7:
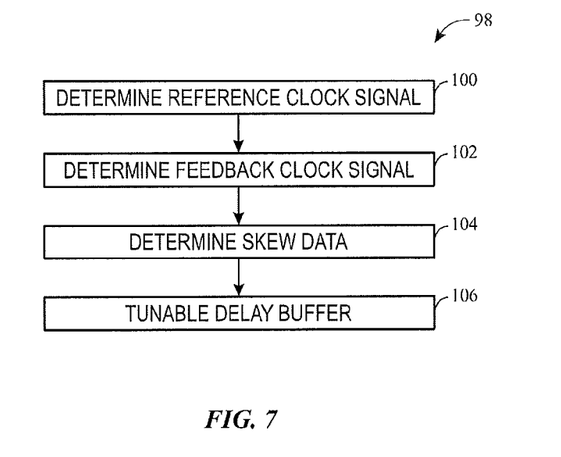
FIG. 7 is a flow diagram of a process for controlling operation of the clock tree of FIG. 3, in accordance with an embodiment.

One embodiment of a process 98 for determining expected clock skew and adjusting operation of a clock tree 16 accordingly is described in FIG. 7. Generally, the process 98 includes determining a reference clock signal (process block 100), determining a feedback clock signal (process block 102), determining skew data (process block 104), and adjusting operation of a tunable delay buffer based at least in part on the skew data (process block 106). In some embodiments, the process 98 may be implemented based on circuit connections formed in one or more clock switch blocks 64 and/or the controller 18. Additionally or alternatively, in some embodiments, the process 98 may be implemented by executing instructions stored in a tangible, non-transitory, computer-readable medium, such as the controller memory 22, using a processor, such as the controller processor 20.

Accordingly, in some embodiments, a clock switch device 64 may determine a reference clock signal 80 (process block 100) and determine a feedback clock signal 82 (process block 102). In some embodiments, the feedback clock signal 82 determined may correspond with the branch 60 for which expected clock skew is to be determined. Additionally, in some embodiments, the reference clock signal 80 may be the feedback clock signal 82 corresponding with another branch 60 in the clock tree 16.

As described above, a clock switch block 64 may receive feedback clock signals 82 from downstream clock switch blocks 64. For example, with regard to FIG. 3, a central clock switch block 64C may receive a first feedback signal 82 from the first branch 60A and a second feedback signal 82 from the second branch 60B. As described above, the feedback signal 80 used as the reference clock signal 80 may be determined based at least in part on branch 60 for which the expected clock skew is to be determined. For example, to determine expected clock skew associated with the second branch 60B, the central clock switch block 64C may use the first feedback clock signal 82 as the reference clock signal 80. On the other hand, to determine expected clock skew associated with the first branch 60A, the central clock switch block 64C may use the second feedback clock signal 82 as the reference clock signal 80.

Additionally, in some embodiments, more than two branches 60 may be implemented in a clock tree 16. For example, the central clock switch block 64C may potentially route the source clock signal 84 through four different branches 60 and, thus, potentially receive four feedback signals 82. Thus, in some embodiments, a clock switch block 64 may include a first mux to select which clock signal is input to the phase detector 76 as the reference clock signal 80 and a second mux to select which clock signal is input to the phase detector 76 as the feedback clock signal 82.

Based at least in part on the feedback clock signal 82 and the reference clock signal 80, the phase detector 76 in the clock switch block 64 may determine skew (e.g., time-shift or phase-shift) data (process block 104). In some embodiments, the skew data may indicate whether the feedback clock signal 82 is leading or lagging the reference clock signal 80. Additionally, in some embodiments, the clock skew data may indicate magnitude (e.g., duration, time period, or phase angle) of variation between the feedback clock signal 82 and the reference clock signal 80.

Thus, in some embodiments, the phase detector 76 may determine the skew data by comparing the feedback clock signal 82 and the reference clock signal 80. For example, the phase detector 76 may determine the skew data based at least in part whether a rising edge on the reference clock signal 80 lead or lags a corresponding (e.g., closest in time) rising edge on the feedback clock signal 82 and duration between the rising edge on the reference clock signal 80 and the corresponding rising edge on the feedback block signal 82. Additionally or alternatively, the phase detector 76 may determine the skew data based at least in part whether a falling edge on the reference clock signal 80 lead or lags a corresponding (e.g., closest in time) falling edge on the feedback clock signal 82 and duration between the falling edge on the reference clock signal 80 and the corresponding falling edge on the feedback block signal 82.

Based at least in part on the skew data, the controller 18 may instruct one or more tunable delay buffers 72 to adjust applied delay (process block 106). In some embodiments, the controller 18 may receive the skew data from the clock switch block 64 and communicate control signals (e.g., commands) to a tunable delay buffer 72 indicating amount of delay that should be applied to subsequently communicated source clock signals 84. In this manner, operation of the tunable delay buffers 72 may be controlled to reduce likelihood and/or magnitude of variation in clock skew introduced by different branches 60, which may improve operation of the integrated circuit device 12, for example, by facilitating coordinated operation of multiple logic regions 48 with improved operational efficiency and/or reduced operational latency.

Figure 8:
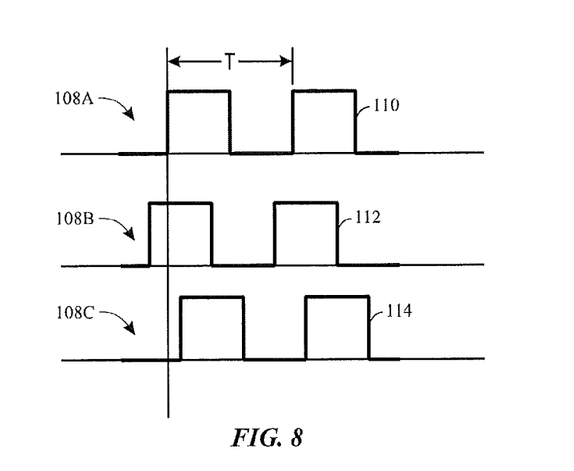
FIG. 8 illustrates timing diagrams of a reference clock signal and feedback clock signals, in accordance with an embodiment.

To help illustrate, timing diagrams 108 describing clock signals received by a clock switch block 64 are shown in FIG. 8. In particular, a first timing diagram 108A includes a first waveform 110 representative of a reference clock signal 80. Additionally, a second timing diagram 108B includes a second waveform 112 representative of a first feedback clock signal 82 and a third timing diagram 108C includes a third waveform 114 representative of a second feedback clock signal 82.

Based on the rising edges and/or falling edges of first waveform 110 and the second waveform 112, the clock switch block 64 may determine skew data that indicates that the first feedback clock signal 82 leads the reference clock signal 80 by approximately one-eighth of the clock cycle (T). As such, based at least in part on the skew data, the controller 18 may instruct one or more tunable delay buffers 74 on a corresponding branch 60 to increase delay applied to subsequently communicated source clock signals 84 such that the resulting first feedback clock signal 82 is expected to be delayed an additional one-eighth of the clock cycle (T). Additionally or alternatively, the controller 18 may instruct one or more tunable delay buffers 74 on a corresponding branch 60 to reduce delay applied to subsequently communicated source clock signals 84 such that the resulting first feedback clock signal 82 is expected to be advanced seven-eighths of the clock cycle (T).

Additionally, based on the rising edges and/or falling edges of first waveform 110 and the third waveform 114, the clock switch block 64 may determine skew data that indicates that the second feedback clock signal 82 lags the reference clock signal 80 by approximately one-eighth of the clock cycle (T). As such, based at least in part on the skew data, the controller 18 may instruct one or more tunable delay buffers 74 on a corresponding branch 60 to increase delay applied to subsequently communicated source clock signals 84 such that the resulting first feedback clock signal 82 is expected to be delayed an additional seven-eighths of the clock cycle (T). Additionally or alternatively, the controller 18 may instruct one or more tunable delay buffers 74 on the corresponding branch 60 to reduce delay applied to subsequently communicated source clock signals 84 such that the resulting first feedback clock signal 82 is expected to be advanced one-eighth of the clock cycle (T).

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. An integrated circuit device, comprising:
    a first logic region comprising a first plurality of logic gates that operate based at least in part on a first clock signal to facilitate providing a target function;
    a clock tree comprising:
        a first clock switch block that receives a source clock signal from a clock source;
        a first branch communicatively coupled between the first clock switch block and the first logic region, wherein:
            the first branch operates to provide the first clock signal to the first logic region based at least in part on the source clock signal; and
            the first branch comprises a first tunable delay buffer that operates to apply a first delay to the first clock signal based at least in part on a first clock skew expected to be introduced by the first branch.

2. The integrated circuit device of claim 1, comprising a second logic region comprising a second plurality of logic gate that operate based at least in part on a second clock signal to facilitate providing the target function in cooperation with the first logic region;
    wherein the clock tree comprises a second branch communicatively coupled between the first clock switch block and the second logic region, wherein the second branch operates to provide the second clock signal to the second logic region based at least in part on the source clock signal.

3. The integrated circuit device of claim 2, comprising a controller communicatively coupled to the first clock switch block and the first tunable delay buffer, wherein:
    the first clock switch block:
        receives a first feedback clock signal from the first branch;

receives a second feedback clock signal from the second branch; and determines skew data indicative of the first clock skew based at least in part on the first feedback clock signal and the second feedback clock signal; and the controller instructs the first tunable delay to adjust the first delay applied to the first clock signal based at least in part on the skew data.

4. The integrated circuit device of claim 3, wherein the skew data indicates whether the first feedback clock signal leads the second feedback signal, whether the first feedback clock signal lags the second feedback signal, a first duration the first feedback clock signal leads the second feedback signal, a second duration the first feedback clock signal lags the second feedback signal, or any combination thereof.

5. The integrated circuit device of claim 1, wherein:
the first clock switch block:
receives a feedback clock signal from the first branch; and
compares the feedback clock signal with a reference clock signal; and
the first tunable delay buffer applies the first delay based at least in part on comparison between the feedback clock signal and the reference clock signal, wherein the first delay is expected to reduce variation between the feedback clock signal and the reference clock signal.

6. The integrated circuit device of claim 1, wherein the first clock switch block:
selectively routes the source clock signal to the first branch or a second branch of the clock tree based at least in part on routing configuration data;
receives a first feedback clock signal from the first branch;
receives a second feedback clock signal from the second branch; and
determines skew data indicative of the first clock skew based at least in part on the first feedback clock signal and the second feedback clock signal.

7. The integrated circuit device of claim 1, wherein the clock tree comprises a second clock switch block communicatively coupled to the first clock switch block via the first branch, wherein:
the second clock switch block receives the first clock signal via the first branch;
provides the first clock signal to the first logic region via a clock signal interface; and
communicates a feedback signal to the first clock switch block after the first clock signal is provided to the first logic region.

8. The integrated circuit device of claim 1, wherein the first branch comprises:
a first clock interconnect that communicatively couples the first clock switch block to the first tunable delay buffer; and
a second clock interconnect that communicatively couples the first tunable delay buffer to a second clock switch block.

9. The integrated circuit device of claim 1, wherein:
the first logic region comprises a mux, a flip-flop, a logic block, a look-up-table, a register, or any combination thereof; and
the target function comprises a combinational function, a sequential function, an arithmetic function, a logic function, a custom function, or any combination thereof.

10. The integrated circuit device of claim 1, wherein the integrated circuit device comprises a field-programmable gate array.

11. A method for controlling operation of an integrated circuit device, comprising:
routing, using a clock switch block, a source clock signal to a first branch in a clock tree to enable a first logic region of the integrated circuit device communicatively coupled to the first branch to operate based at least in part on the source clock signal;
routing, using the clock switch block, the source clock signal to a second branch in the clock tree to enable a second logic region of the integrated circuit device communicatively coupled to the second branch to operate based at least in part on the source clock signal;
receiving, using the clock switch block, a first feedback clock signal from the first branch, wherein the first feedback clock signal comprises the source clock signal with a first delay introduced by the first branch;
receiving, using the clock switch block, a second feedback clock signal form the second branch, wherein the second feedback clock signal comprises the source clock signal with a second delay introduced by the second branch; and
determining, using the clock switch block, skew data indicative of phase variation between the first feedback clock signal and the second feedback clock signal to enable the integrated circuit device to adjust the first delay, the second delay, or both to reduce magnitude of the phase variation.

12. The method of claim 11, comprising:
instructing, using a controller, a first tunable delay buffer on the first branch to adjust the first delay based at least in part on the skew data;
instructing, using the controller, a second tunable buffer on the second branch to adjust the second delay based at least in part on the skew data; or
both.

13. The method of claim 11, wherein determining the skew data comprises:
determining whether the first feedback clock signal leads the second feedback signal; and
when the first feedback clock signal lead the second feedback clock signal:
determining a duration the first feedback clock signal leads the second feedback clock signal; and
determining the skew data to indicate that the first feedback clock signal lead the second feedback clock signal and the duration to enable the integrated circuit device to adjust the first delay, the second delay, or both to reduce the duration.

14. The method of claim 11, wherein determining the skew data comprises:
detecting a first rising edge of the first feedback signal;
detecting a second rising edge of the second feedback signal; and
determining the skew data to indicate a duration between the first rising edge and the second rising edge to enable the integrated circuit device to adjust the first delay, the second delay, or both to facilitate coordinating operation of the first logic region and the second logic region.

15. The method of claim 11, wherein:
routing the source clock signal to the first branch comprises routing the source clock signal through a first tunable delay buffer that introduces at least a first portion of the first delay; and
routing the source clock signal to the second branch comprises routing the source clock signal through a second tunable delay buffer that introduces at least a second portion of the second delay.

16. The method of claim 11, wherein:
  routing the source clock signal to the first branch comprises routing the source clock signal through a first length of conductive interconnects; and
  routing the source clock signal to the second branch comprises routing the source clock signal through a second length of conductive interconnects different from the first length.

17. A tangible, non-transitory, computer-readable medium that stores instructions executable by one or more processors in an electrical system, wherein the instructions comprise instruction to:
  determine, using the one or more processors, skew data indicative of difference between a first delay introduced on a source clock signal resulting from routing the source clock signal to a first portion of an integrated circuit device via a clock tree and a second delay introduced on the source clock signal resulting from routing the source clock signal to a second portion of the integrated circuit device via the clock tree; and
  instruct, using the one or more processors, one or more tunable delay buffers to adjust delay applied to the source clock signal by the clock tree based at least in part on the skew data to facilitate coordinating operation of the first portion of the integrated circuit device and the second portion of the integrated circuit device.

18. The computer-readable medium of claim 17, wherein the instructions to instruct the one or more tunable delay buffers to adjust delay applied comprises instructions to, when the skew data indicates that a first feedback clock signal received from a first branch of the clock tree used communicate the source clock signal to the first portion of the integrated circuit device leads a second feedback clock signal received from a second branch of the clock tree used to communicate the source clock signal to the second portion of the integrated circuit device:
  instruct a first tunable delay device on the first branch of the clock tree to increase the first delay;
  instruct a second tunable delay device on the second branch to decrease the second delay; or
  both.

19. The computer-readable medium of claim 17, wherein the instructions to instruct the one or more tunable delay buffers to adjust delay applied comprises instructions to, when the skew data indicates that a first feedback clock signal received from a first branch of the clock tree used communicate the source clock signal to the first portion of the integrated circuit device lags a second feedback clock signal received from a second branch of the clock tree used to communicate the source clock signal to the second portion of the integrated circuit device:
  instruct a first tunable delay device on the first branch of the clock tree to decrease the first delay;
  instruct a second tunable delay device on the second branch to increase the second delay; or
  both.

20. The computer-readable medium of claim 17, comprising instructions to store configuration data in configuration memory of the integrated circuit device, wherein the configuration data:
  adjusts first operations performed by the first portion of the integrated circuit device;
  adjusts second operations performed by the second portion of the integrated circuit device;
  routing of the source clock signal through the clock tree to the first portion of the integrated circuit device;
  routing of the source clock signal through the clock tree to the second portion of the integrated circuit device; or
  any combination thereof.

* * * * *